United States Patent [19]

Steinegger

[11] 4,380,007
[45] Apr. 12, 1983

[54] PROXIMITY SWITCH

[75] Inventor: Walther Steinegger, Schaffhausen, Switzerland

[73] Assignee: Playmont AG, Switzerland

[21] Appl. No.: 267,819

[22] Filed: May 27, 1981

[30] Foreign Application Priority Data

May 27, 1980 [CH] Switzerland .................. 4106/80

[51] Int. Cl.³ ............................................. G08C 9/02
[52] U.S. Cl. .......................... 340/365 C; 200/DIG. 1
[58] Field of Search ............... 178/19, 18; 340/365 C, 340/365 R, 365 S; 200/181, DIG. 1; 361/288; 400/479.1

[56] References Cited

U.S. PATENT DOCUMENTS

| | | | |
|---|---|---|---|
| 3,668,698 | 6/1972 | Demirdjioghlou et al. | 340/365 C |
| 4,027,569 | 6/1977 | Luce et al. | 340/365 C |
| 4,132,487 | 1/1979 | Fisher | 340/365 C |
| 4,293,734 | 10/1981 | Pepper, Jr. | 178/19 |

FOREIGN PATENT DOCUMENTS 129950  2/1978  German Democratic Rep. ............................ 340/365 C Primary Examiner—Thomas A. Robinson
Attorney, Agent, or Firm—Karl W. Flocks; A. Fred Starobin

[57] ABSTRACT

The proximity switch has a capacitive sensor which comprises a metallic support mounted on a printed circuit board and supporting, on a surface parallel to said board but facing away from it, a layer made of electrically conductive foam material. The latter nestles against a cover plate made of glass which provides the dielectric of a capacitive sensor actuatable by the stray field of the mains. When this alternating stray field is concentrated by a part of a human body brought into the vicinity of the sensor, the latter will actuate an electronic switch connected to it.

6 Claims, 2 Drawing Figures

PROXIMITY SWITCH

BACKGROUND OF THE INVENTION

The invention relates to a contactless switch, which can be actuated without touching electrically conductive parts. Switches of this kind are known, which work on the principle that the alternating electrical field induced within most buildings by the electrical means is being concentrated by the dielectric of human bodies, and that when a part of a body is brought near an adequately built sensor, the latter can produce a signal which is used to command an electrical circuit.

DESCRIPTION OF THE PRIOR ART

The sensor—or sensor key—usually works capacitively and consists in general of a dielectric layer, one side of which is brought as close as possible to a metallic electrode, itself connected with the electrical switching circuit, whilst the opposite side of the dielectric layer is arranged so that it may be touched with a finger, for instance. Because the induced 50 or 60 Hz stray field is weak, the sensor key must work as efficiently as possible, which on one hand requires a comparatively thin layer having a high dielectric constant, and on the other hand requires avoiding the existence of an air gap between said layer and the electrode surface. The first condition may easily be met by the use of a plastic film as dielectric layer, but the second condition requires either a very precise mechanical fit, or else suggests that the metallic surface be vapor-deposited on the dielectric material. However, such solutions are inadequate or even unuseable for many practical applications. Although proximity switches of the kind described above are, for instance, particularly suited for electronic game automatons, it is clear that the often rough working conditions in which these are run practically exclude the use of plastic films as touching surfaces. Such automatons require the use of a mechanically very resistant dielectric material, such as a glass plate having a thickness of several millimeters, for instance. If, as is generally the case, several sensor keys are arranged on one single covering surface, then it becomes difficult to align all electrodes exactly with respect to a stiff covering plate, and air gaps are well-nigh unavoidable. A vapor deposition of the metal surfaces onto the covering plate also is not adequate, because the vapor-deposited surfaces must then severally be connected with the corresponding electrical circuits, where the latter usually are provided as printed circuits on a board which can be fixed parallel to the covering plate. Obviously, the provision of a large number of such electrical connections is complicated, in particular because it is often advantageous to be able to combine at will different types of printed circuit boards and of covering plates.

SUMMARY OF THE INVENTION

The invention aims at avoiding the drawbacks stated above, and at providing an easily built, sensitive switch, the cover plate of which may consist of a stiff material having a thickness of several millimeters without requiring a very precise alignment of the electrode supports in order to avoid air gaps. To this end, the proximity switch of the invention has a capacitive sensor which comprises a metallic support on a printed circuit board and supporting, on a surface parallel to said board but facing away from it, a layer made of electrically conductive foam material. The latter nestles against a cover plate made of glass which provides the dielectric of a capacitive sensor actuatable by the stray field of the mains. When this alternating stray field is concentrated by a part of a human body brought into the vicinity of the sensor, the latter will actuate an electronic switch connected to it.

BRIEF DESCRIPTION OF THE DRAWINGS

In what follows, the invention shall be described with the help of the drawing. The description makes reference to the annexed drawings, wherein.

DETAILED DESCRIPTION OF A PREFERRED EMBODIMENT

Figure 1:
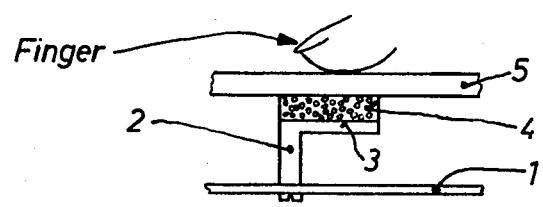
FIG. 1 schematically shows a section through a sensor and a finger actuating the same, and FIG. 2 schematically shows part of the command circuit of a switching circuit.

FIG. 1 shows the relative positions of a support plate 1, which in the present embodiment is a printed circuit board made of epoxy, and of a metallic support 2, the upper surface 3 of which supports a layer made of an electrically conductive foamed material 4. The layer of foamed material forms one electrode of a capacitor, the dielectric of which is provided by the glass of a covering glass plate 5. The latter is fixed (in a way not shown in the drawing) parallel to, and at a certain distance from the printed circuit boared 1. Typically, the latter will carry a plurality of supports 2, the upper surfaces 3 of which will essentially lie in one and the same plane. Because of manufacturing tolerances, and also because the glass plate 5 can bend slightly, the surface 3 may on occasion make a slight angle with respect to the glass plate. However, thanks to the resilience of the foamed layer 4, the latter will still make full contact with the stiff glass plate 5, and no air gap will appear between both, as would be practically unavoidable if one did use a stiff metallic electrode and also a stiff material for the covering plate. The snug fit between the foam electrode and the covering plate does not only improve the sensitivity of the sensor, but it will also lessen the cross-talk which arises when several sensors lie side by side. This influence on neighboring sensors exerted by the stray field of an actuated sensor will be lessened, in part because the actuating field of the latter is partially constricted by the foamed material, provided the latter has a high dielectric constant.

Moreover the combination of a solid support 2 with a resilient electrode layer 4 makes it easy to build together a prefabricated base board 1 with the cover plate 5 which forms the dielectric of the capacitive sensors, even if both components have been manufactured at different places or by different producers. Although the cover plate of the described embodiment consists of glass, other insulating materials may also be used.

The thickness of the covering plate may be chosen in a wide range, although one must take into account that a great thickness requires an accordingly high value of the dielectric constant of the material used, which constant should e.g. preferably exceed 3 when the thickness of the covering plate is greater than 3 mm.

Figure 2:
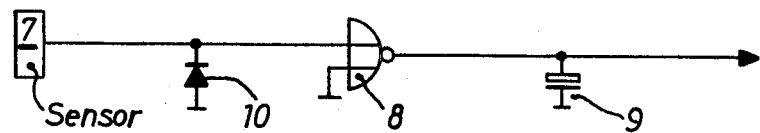

FIG. 2 shows an embodiment of a part of the switching circuit which is connected at the output of the sensor of FIG. 1. This sensor, schematically shown in 7, is connected to an input of a buffered CMOS-gate 8, the output of which is connected to the ground through a capacitor 9. By properly adapting the capacitor to the output resistivity of the gate, one can effectively suppress transient disturbances. This sensitivity of the device can be varied within certain limits by varying the supply voltage of the gate. In order to provide a high ohmic operating point for the input of the gate, there is provided a medium current diode 10, which should preferably have a small reverse current.

While there are shown and described present preferred embodiments of the invention, it is to be distinctly understood that the invention is not limited thereto, but may be otherwise variously embodied and practiced within the scope of the following claims. ACCORDINGLY,

What is claimed is:

1. Proximity switch actuated by an alternating electrical field comprising
    a circuit-carrying base plate;
    at least one capacitively actuatable sensor protruding from said circuit-carrying base plate;
    said sensor including
        a metallic support having a surface facing away from said base plate,
        a layer of electrically conductive foamed material lining said surface of said metallic support.

2. Switch according to claim 1, characterized by a stiff cover plate made of dielectric material, which touches the free surface of the conductive foamed material.

3. Switch according to claim 2, characterized in that the cover plate is made of glass.

4. Switch according to claim 1, 2, or 3 characterized by
    additional ones of said sensors each having said foamed material;
    free surfaces of said foamed material on said sensors lying essentially in the same plane and each forming an electrode;
    each said electrode electrically connected to a circuit on said circuit-carrying base plate, said circuit being actuatable through the action of an alternating electrical field on the corresponding said electrode.

5. Switch according to claim 4, characterized in that said circuits are printed circuits applied on said base plate.

6. Proximity switch according to claim 5, characterized in that each circuit comprises a CMOS-gate, one input of which is connected to the corresponding electrode and, through a diode, to ground, a further input of said gate being connected directly to ground and its output being connected to ground through a capacitor.

* * * * *